United States Patent
Watanabe et al.

(10) Patent No.: US 7,927,974 B2
(45) Date of Patent: Apr. 19, 2011

(54) METHOD OF FORMING A MODIFIED LAYER IN A SUBSTRATE

(75) Inventors: Yosuke Watanabe, Ota-Ku (JP); Kenji Furuta, Ota-ku (JP); Kiyoshi Ohsuga, Ota-ku (JP)

(73) Assignee: Disco Corporation, Tokyo (JP)

( * ) Notice: Subject to any disclaimer, the term of this patent is extended or adjusted under 35 U.S.C. 154(b) by 264 days.

(21) Appl. No.: 12/270,649

(22) Filed: Nov. 13, 2008

(65) Prior Publication Data
US 2009/0149002 A1 Jun. 11, 2009

(30) Foreign Application Priority Data
Dec. 6, 2007 (JP) .................. 2007-315932

(51) Int. Cl.
*H01L 21/00* (2006.01)
(52) U.S. Cl. ........................ 438/463; 438/460
(58) Field of Classification Search ........... 438/460–464
See application file for complete search history.

(56) References Cited

U.S. PATENT DOCUMENTS

| | | | |
|---|---|---|---|
| 6,117,707 A * | 9/2000 | Badehi ........................ | 438/113 |
| 7,138,297 B2 * | 11/2006 | Iijima et al. .................. | 438/113 |
| 7,776,720 B2 * | 8/2010 | Boyle et al. .................. | 438/463 |
| 2006/0255431 A1 * | 11/2006 | Sekiya .......................... | 257/620 |
| 2008/0153264 A1 * | 6/2008 | Nakamura et al. ............ | 438/463 |
| 2009/0170289 A1 * | 7/2009 | Furuta ........................... | 438/463 |

FOREIGN PATENT DOCUMENTS
JP 2005-95952 4/2005
* cited by examiner

*Primary Examiner* — Richard A. Booth
(74) *Attorney, Agent, or Firm* — Greer, Burns & Crain, Ltd

(57) ABSTRACT

First, mapping data storing interrupted areas is obtained. In a first modified-layer forming step, before a stacked article is stacked on a front surface of a substrate, a laser beam is directed to the interrupted areas based on the mapping data to form modified layers only at the interrupted areas. After the stacked articles have been stacked on the substrate, in a second modified-layer forming step, the laser beam is directed at least to the predetermined dividing line formed with no modified layer in the first modified-layer forming step to form a modified layer.

2 Claims, 5 Drawing Sheets

METHOD OF FORMING A MODIFIED LAYER IN A SUBSTRATE

BACKGROUND OF THE INVENTION

1. Field of the Invention

The present invention relates to a modified-layer forming method of forming a modified layer inside a substrate by directing a laser beam to the substrate such as a semiconductor wafer or the like.

2. Description of the Related Art

A substrate such as a semiconductor wafer is sectioned by predetermined dividing lines into device areas to be formed with devices thereon. After the devices are formed in the device areas, the substrate is subjected to steping such as polishing. The substrate is cut along the predetermined dividing lines to provide the devices (semiconductor chips). Various methods are adopted as substrate cutting methods, including a method of using a cutting blade, and a method of cutting a wafer by directing a laser beam to the wafer to form slits therein by a thermal transpiration phenomenon called ablation.

One of the substrate cutting methods described above is a method of dividing a substrate by forming a modified layer, a fragile area, inside the substrate and applying external force to it for division (see Japanese Patent Laid-Open No. 2005-95952). According to this method, a laser beam capable of passing through a substrate is focused on the inside of the substrate and directed thereto along predetermined cutting lines to form a modified-layer inside the substrate. Thereafter, external force is applied to the substrate to split it from a portion made more fragile by the laser beam. Thus, the substrate is divided into a large number of individual devices along the predetermined dividing lines.

Incidentally, TEGs, test patterns, and stacked articles on a substrate, which absorb or reflect a laser beam, are present on an optical path irradiated with the laser beam in some cases. If a laser beam is directed along a predetermined dividing line with such a stacked article stacked on the optical path of the laser beam, the laser beam is not applied only to an area covered by the stacked article acting as an obstacle. In such a case, since the laser beam does not reach the inside of the substrate, an area formed with no modified-layer is caused in the substrate after the laser beam irradiation. If external force is applied to the substrate in such a condition, since an area formed with no modified-layer is present inside the substrate, a device subjected to the division may be likely to produce chippings, i.e., cracks or burrs. In addition, a problem may occur in that the substrate is split while largely deviating from a predetermined dividing line.

SUMMARY OF THE INVENTION

Accordingly, it is an object of the invention to provide a method of reliably forming a modified-layer inside a substrate with a laser beam even if the substrate is stacked with a stacked article on an optical path of the laser beam when the modified layer is formed inside the substrate by directing the laser beam to the substrate along a predetermined dividing line.

In accordance with an aspect of the present invention, there is provided a method of forming a modified layer inside a substrate, the substrate having a plurality of device areas sectioned by predetermined dividing lines, stacked articles being stacked on the device areas of the substrate or on the predetermined dividing lines, the method including the step of directing a laser beam along the predetermined dividing line to form a modified layer inside the substrate before the stacked articles are formed on the substrate.

In the method of forming a modified layer in a substrate according to the present invention, before the stacked articles are stacked on the substrate, the modified layer is previously formed inside the substrate by irradiation of the laser beam. Thus, the modified layer is formed over the entire areas of the entire predetermined dividing lines. As a result, while production of chippings is prevented, the substrate can be split along the predetermined dividing lines.

In accordance with another aspect of the present invention, there is provided a method of forming a modified layer inside a substrate, the substrate having a plurality of device areas sectioned by predetermined dividing lines, stacked articles being stacked on the device areas of the substrate or on the predetermined dividing lines, the method including: a mapping data obtaining step for previously obtaining mapping data storing an interrupted area which is an area, on the predetermined dividing line, where the stacked article becomes an obstacle to irradiation of a laser beam so as to make it impossible to form a modified layer; a first modified-layer forming step, before stacking of the stacked article on the substrate, for directing a laser beam to the interrupted area based on the mapping data to form a modified layer only at the interrupted area; and a second modified-layer forming step, after the stacking of the stacked article on the substrate, for directing the laser beam at least to an area formed with no modified layer by the first modified-layer forming step along the predetermined dividing line to form a modified layer along the predetermined dividing line.

According to this method, in the first modified-layer forming step, the laser beam is directed to the interrupted area based on the previously obtained mapping data to thereby form a modified layer only at the interrupted area. Next, in the second modified-layer forming step, after the stacked article has been stacked on the substrate, a laser beam is directed at least to the predetermined dividing line formed with no modified layer in the first modified-layer forming step to form a modified layer. Thus, the modified layer is formed over the entire areas of the predetermined dividing lines including the interrupted areas. As described above, by obtaining the mapping data in advance, the modified layer can be formed only at the interrupted area before the stacked article is stacked on the substrate.

Incidentally, the substrate lowers in strength in proportion to the length of the predetermined dividing lines formed with the modified layers. In other words, the shorter the predetermined dividing lines formed with the modified layers, the more the strength of the substrate can be maintained after the formation of the modified layers. In the present invention, the modified layer is formed only at the interrupted area as a required minimum area in the first modified-layer forming step; therefore, the strength of the substrate can be prevented from being reduced. As a result, even after the first modified-layer forming step, handling liable to apply external force to the substrate or stacking work of a stacked article can be smoothly carried out. In addition, it is not necessary to direct the laser beam from the rear surface of the substrate; therefore, even the substrate stacked with the stacked articles on the front surface and formed with the metal film on the rear surface can be formed with the modified layers over the entire areas of all the predetermined dividing lines.

According to the present invention, even the substrate stacked with the stacked articles on the predetermined dividing lines can reliably be formed with the modified layers inside the substrate along all the predetermined dividing lines. This can provide an effect of preventing production of chippings and of splitting the substrate along the predetermined dividing lines upon application of external force to the substrate. In addition, the modified layer is formed only at the interrupted area in the first modified-layer forming step and the modified layer is formed along the remaining predetermined dividing lines in the second modified-layer forming step; therefore, the strength of the substrate can be maintained after the first modified-layer forming step. This provides an effect that handling or stacking work of a stacking article can smoothly be carried out and the modified layers can be formed along all the predetermined dividing lines.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1A:
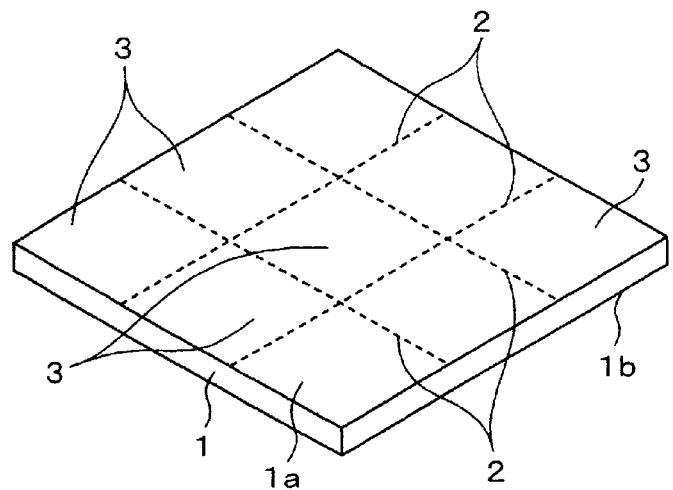
FIG. 1A is a perspective view of a substrate to be formed with a modified layer by a modified-layer forming method according to an embodiment of the present invention.
Figure 1B:
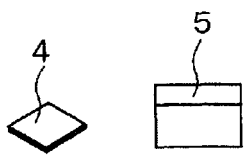
FIG. 1B is a perspective view illustrating stacked articles stacked on a front surface of the substrate shown in FIG. 1A.
Figure 1C:
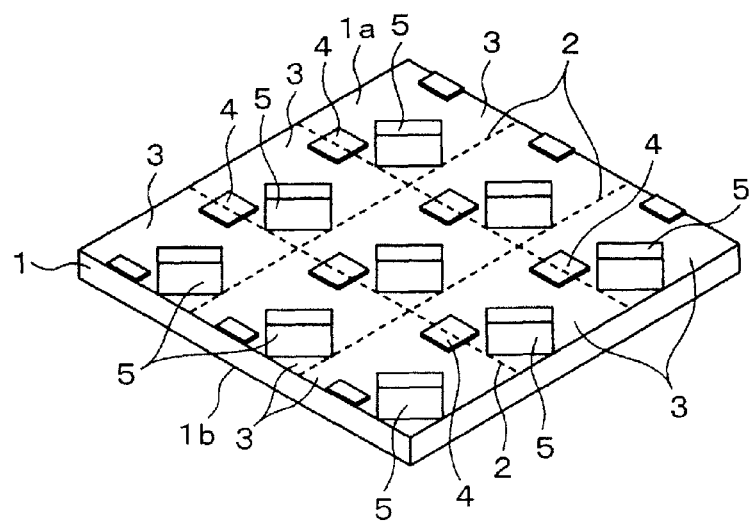
FIG. 1C is a perspective view of a substrate stacked with stacked articles.

A preferred embodiment of the present invention will hereinafter be described with reference to the drawings. Reference numeral 1 of FIG. 1A denotes a substrate to be formed with a modified layer by a modified-layer forming method according the embodiment. This substrate 1 is a silicon wafer or the like. A plurality of rectangular device areas 3 are sectioned on a front surface 1a of the substrate 1 along lattice-like predetermined dividing lines 2. Stacked articles 4, 5 such as TEGs, elements and the like shown in FIG. 1B are stacked in these device areas 3. These stacked articles 4, 5 are formed of a material such as metal absorbing or reflecting a laser beam. FIG. 1C illustrates the substrate 1 (the assembly) stacked with the stacked articles 4, 5 on the front surface 1a. The stacked article 4 is stacked to cover the predetermined dividing line 2 and to be spanned between adjacent device areas 3. The stacked article 4 is cut along the corresponding dividing line 2 concurrently with division of the substrate 1. In addition, the stacked article 5 is stacked to cover the optical path of a laser beam detailed later. Finally, the substrate 1 is cut and divided along the predetermined dividing lines 2 into a plurality of the individual devices.

The substrate 1 stacked with the stacked articles 4, 5 thereon is formed with modified layers, fragile areas, inside the substrate 1 by a laser beam and subjected to external force to be divided into individual devices. In the modified-layer forming method, a laser beam is focused inside the substrate 1 and directed along the predetermined dividing line 2 of the substrate 1 with the stacked articles 4, 5 thereon. Thus, the modified layer is formed inside the substrate 1 along the predetermined dividing line 2. A laser steping machine for forming the modified layer in the substrate 1 is preferably used that is configured similarly to the machine described in Japanese Patent Laid-Open No. 2005-95952.

Irradiation conditions of a laser beam directed to the substrate 1 are set, for example, as below:

| | |
|---|---|
| Light source | LD excitation Q switch Nd: YVO4 |
| Wavelength | 1064 nm of a pulse laser |
| Repetition frequency | 100 kHz |
| Pulse width | 40 ns |
| Average power | 1 W |
| Focusing spot diameter | φ1 μm |
| Steping-transfer speed | 100 mm/sec |

Figure 2A:
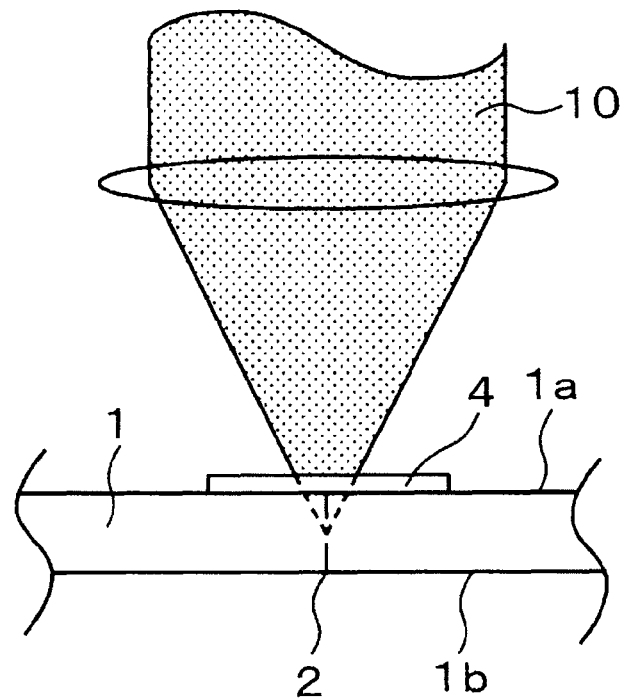
FIGS. 2A and 2B are sectional views each illustrating a condition where a laser beam is directed to the substrate shown in FIG. 1C.
Figure 2B:
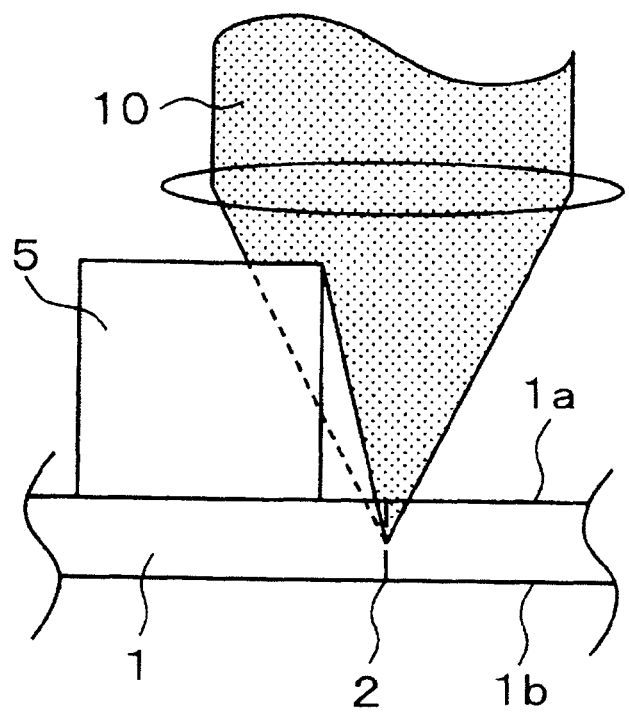
Figure 3:
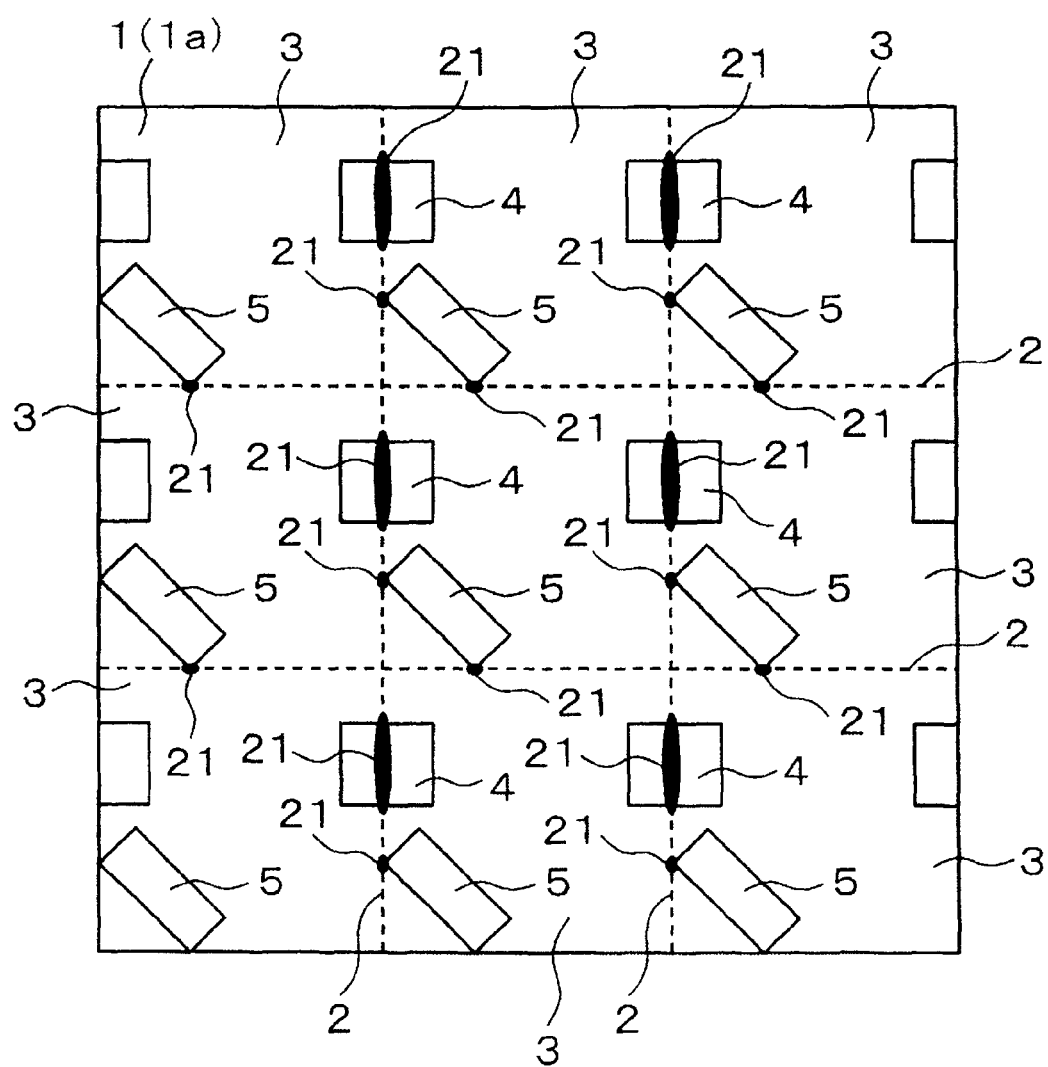
FIG. 3 is a plan view illustrating interrupted areas of the substrate shown in FIG. 1C.

A laser beam may be directed to the predetermined dividing lines 2 of the substrate 1 stacked with the stacked articles 4, 5 to cover the predetermined dividing lines 2 as shown in FIG. 1C. In such a case, the stacked articles 4, 5 become obstacles as shown in FIGS. 2A and 2B, which cause areas where the laser beam is not sufficiently directed to the inside of the substrate 1. FIG. 2A illustrates a condition where a laser beam 10 is directed along the predetermined dividing line 2 on which the stacked article 4 is stacked. In this case, since the stacked article 4 is made of a material such as metal absorbing or reflecting a laser beam, it interrupts the laser beam 10. Consequently, a modified layer is not formed at a portion covered by the stacked article 4 on the predetermined dividing line 2. In addition, FIG. 2B illustrates a condition where a laser beam 10 is directed along the predetermined dividing line 2 formed beside the stacked article 5 stacked on the substrate 1. In this case, the stacked article 5 interrupts a portion of the laser beam 10 so that the modified layer is only partially formed compared with a case where the laser beam 10 is directed without interruption. The substrate 1 stacked with the stacked articles 4, 5 as mentioned above is formed with interrupted areas 21 to which the laser beam 10 is not sufficiently directed, as shown in FIG. 3.

Figure 4A:
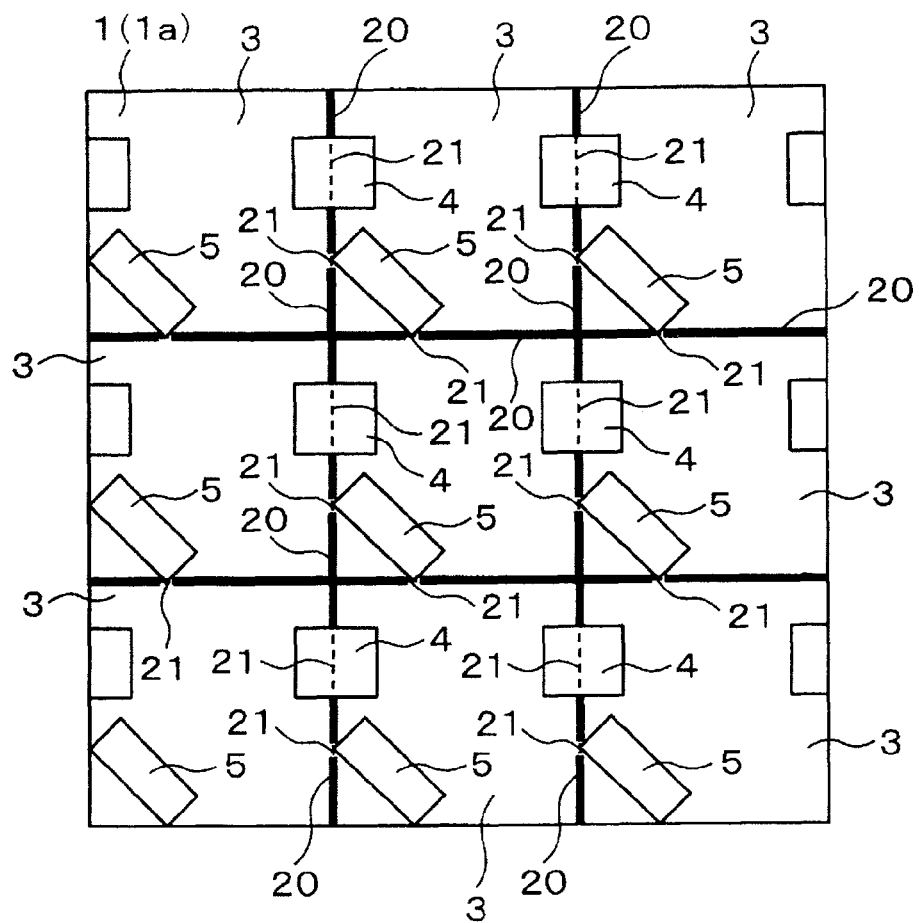
FIG. 4A is a plan view illustrating a substrate where predetermined lines are irradiated with a laser beam.
Figure 4B:
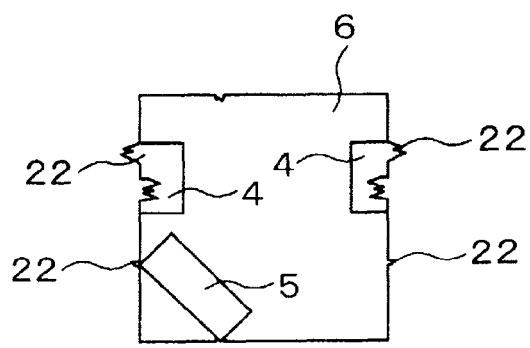
FIG. 4B is a plan view of a device obtained by dividing the substrate of FIG. 4A.

FIG. 4A illustrates the substrate 1 irradiated with the laser beam 10 along the predetermined dividing lines 2. A heavy-line area of the predetermined dividing line 2 indicates an area 20 sufficiently formed with a modified layer. When the substrate 1 is divided into individual pieces by application of external force, a device 6 is likely to cause chippings 22, cracks or burrs, as shown in FIG. 4B. In addition, the substrate 1 may be split while largely deviating from the predetermined dividing line 2. A problem in that the chippings 22 are caused or the substrate 1 is not split along the predetermined dividing line 2 arises caused by the fact that the laser beam 10 is not sufficiently directed to the interrupted area 21 so as not to sufficiently form the modified layer. The present embodiment is effective as a method of reliably forming a modified layer over the whole area of the predetermined dividing lines 2 including the interrupted areas 21 as mentioned above.

Figure 5A:
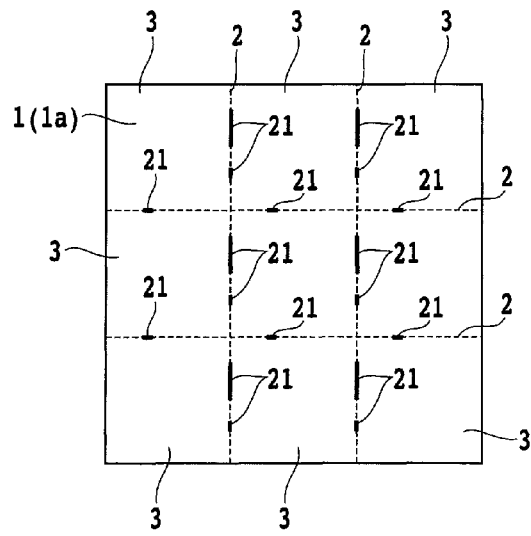
FIGS. 5A through 5D are plan views for assistance in explaining the modified-layer forming method of the embodiment of the invention.
Figure 5B:
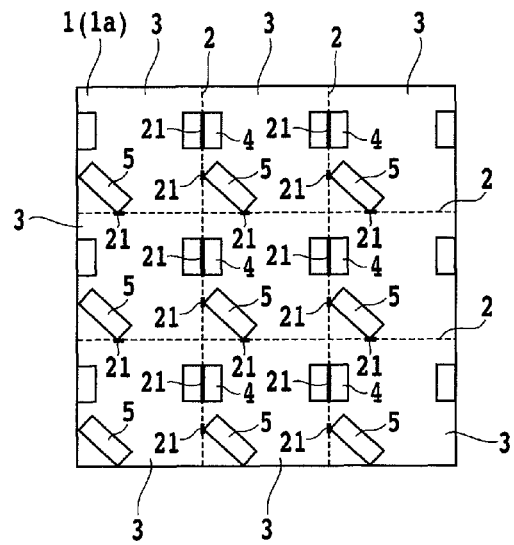
Figure 5C:
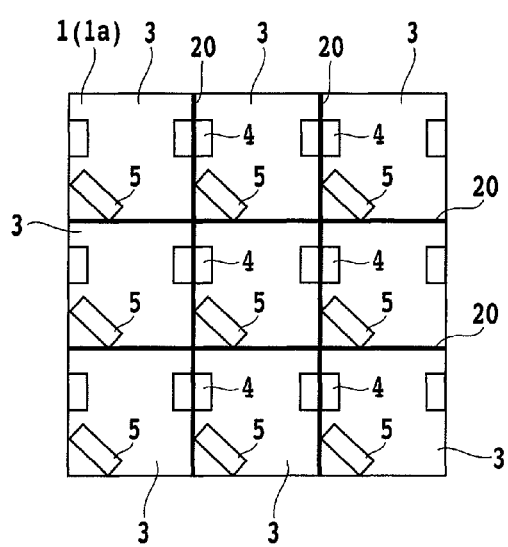

A description is next given of the modified-layer forming method of the present embodiment with reference to FIGS. 5A to 5D. At first, mapping date is obtained which stores the interrupted areas 21 where irradiation of the laser beam 10 is interrupted by the stacked articles 4, 5 in the predetermined dividing lines 2 so as not to enable formation of modified layers. The mapping data is created based on design data of the substrate 1 such as arrangement of the stacked articles 4, 5 and the like. Since the mapping data is different depending on the kinds of the stacked articles and on the stacked positions thereof, it is obtained for each device specification. Next, the laser beam 10 is directed only to interrupted areas 21 of the substrate 1 based on the mapping data obtained (a first modified-layer forming step). This forms modified layers only in the interrupted areas 21 as shown in FIG. 5A. Next, the stacked articles 4, 5 are stacked at respective predetermined positions of the front surface 1a of the substrate 1 as shown in FIG. 5B. After the stacked articles 4, 5 have been stacked on the front surface 1a of the substrate 1, the laser beam 10 is directed along the predetermined dividing lines 2 where the modified layers are not formed in the first modified-layer forming step as shown in FIG. 5B (a second modified-layer forming step). In this case, the laser beam may be directed to the entire areas of the predetermined dividing lines 2. In addition, the laser beam 10 may need only to be directed along such minimum predetermined dividing layers as to reliably split the substrate 1 therealong.

Figure 5D:
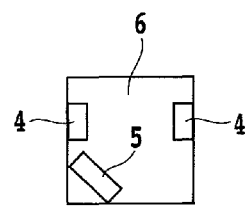

After the laser beam 10 has been directed to the entire areas of all the predetermined dividing lines 2 as described above, external force is applied to the substrate 1. Examples of methods of applying external force to the substrate include a method of using a breaking device which expands the substrate 1 held on a ringlike frame via an adhesive tape. This breaking device includes a table on which the substrate 1 is placed and a clamp mechanism which secures the frame and is moved up and down. The substrate 1 is placed on the table and the frame secured by the clamp mechanism is depressed downwardly relatively to the substrate 1. Thus, while the adhesive tape is expanded, the substrate 1 is pulled toward the frame. Consequently, external force is applied to the substrate 1 and splits it along the predetermined dividing lines 2 formed with the modified layers. In this way, a device 6 split along the predetermined dividing lines 2 is obtained as shown in FIG. 5D.

In the modified-layer forming method of the embodiment described above, before the stacked articles 4, 5 are stacked on the substrate 1, the laser beam 10 is previously directed to the interrupted areas 21 to form the modified layers only at the interrupted areas 21. Thereafter, the laser beam 10 is directed along the predetermined dividing lines 2 other than the interrupted areas 21. Thus, the modified layers are formed on the entire areas of the predetermined dividing lines 2 including the interrupted areas 21. As a result, the production of the chippings 22 is prevented and the substrate 1 is split along the predetermined dividing lines 2.

As described above, by obtaining the mapping data in advance, the modified layers can be formed only at the respective interrupted areas 21 before the stacked articles are stacked on the substrate 1. Incidentally, the substrate 1 lowers in strength in proportion to the lengths of the predetermined dividing lines 2 formed with the modified layers. In other words, the shorter the predetermined dividing lines 2 formed with the modified layers, the more the strength of the substrate 1 can be maintained after the formation of the modified layers. In the present embodiment, the modified layers are formed only at the respective interrupted areas 21 as required minimum areas in the first modified-layer forming step; therefore, the strength of the substrate 1 can be prevented from being reduced. As a result, even after the first modified-layer forming step, handling liable to apply external force to the substrate and stacking work of a stacked article can smoothly be carried out.

If a laser beam 10 is directed from the side of a rear surface 1b using a laser steping machine as in the related art, the substrate 1 is held with the rear surface 1b exposed. In this case, the front surface 1a of the substrate 1 is formed with irregularity resulting from the stacked articles 4, 5, that is, it is difficult to evenly hold the substrate 1. The rear surface 1b of the substrate 1 may be formed with a metal film in some cases. The metal film reflects or interrupts the laser beam 10. If the laser beam 10 is directed from the rear surface 1b of the substrate 1 with the metal film formed on the rear surface 1b, it does not reach the inside of the substrate 1 because the metal film becomes an obstacle, so that the modified layer is not formed.

However, by adopting the modified-layer forming method of the present embodiment, it is not necessary to direct the laser beam 10 from the rear surface 1b of the substrate 1, that is, the laser beam 10 can be directed from the front surface 1a. Therefore, even the substrate stacked with the stacked articles 4, 5 on the front surface 1a and formed with the metal film on the rear surface 1b can reliably be formed with the modified layers over the entire areas of the predetermined dividing lines 2 including the interrupted areas 21.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of forming a modified layer inside a substrate using a laser beam, the laser beam having an optical path, the substrate having a plurality of device areas sectioned by predetermined dividing lines, articles being partially located in the optical path, the method comprising the step of:
   directing the laser beam along the predetermined dividing line to form a modified layer inside the substrate before the articles are formed on the substrate.

2. A method of forming a modified layer inside a substrate, the substrate having a plurality of device areas sectioned by predetermined dividing lines, stacked article being stacked on the device areas of the substrate or on the predetermined dividing lines, the method comprising:
   a mapping data obtaining step for previously obtaining mapping data storing an interrupted area which is an area, on the predetermined dividing line, where the stacked article becomes an obstacle to irradiation of a laser beam so as to make it impossible to form a modified layer;
   a first modified-layer forming step, before stacking of the stacked article on the substrate, for directing a laser beam to the interrupted area based on the mapping data to form a modified layer only at the interrupted area; and
   a second modified-layer forming step, after the stacking of the stacked article on the substrate, for directing a laser beam at least to an area formed with no modified layer by the first modified-layer forming step along the predetermined dividing line to form a modified layer along the predetermined dividing line.

* * * * *